(12) United States Patent
Kurata

(10) Patent No.: US 6,549,825 B2
(45) Date of Patent: Apr. 15, 2003

(54) ALIGNMENT APPARATUS

(75) Inventor: Shunsuke Kurata, Kamiina-gun (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 10/137,936

(22) Filed: May 2, 2002

(65) Prior Publication Data

US 2002/0131848 A1 Sep. 19, 2002

Related U.S. Application Data

(63) Continuation of application No. PCT/JP01/07984, filed on Sep. 14, 2001.

(30) Foreign Application Priority Data

Sep. 14, 2000 (JP) ........................................ 2000-280884

(51) Int. Cl.[7] .............................................. G06F 19/00
(52) U.S. Cl. ................. 700/245; 700/254; 700/256; 700/260; 700/261; 700/218; 414/226.05; 414/217; 414/217.1; 414/939; 414/401; 414/416.03; 414/744.1; 204/298.25; 204/298.35; 204/730; 118/715; 118/719; 118/729; 118/658.11; 901/3; 901/9; 901/30; 901/16; 701/23
(58) Field of Search ................. 700/245, 254, 700/256, 260, 261, 218; 414/226.05, 744.1, 935, 939, 217, 401, 416.03, 222.13, 937, 217.1, 490; 901/3, 9, 30, 16; 29/25.1; 118/719, 729, 658.11, 715, 500, 730; 701/23; 204/298.25, 298.35

(56) References Cited

U.S. PATENT DOCUMENTS

| | | | | |
|---|---|---|---|---|
| 3,968,885 A | * | 7/1976 | Hassan et al. | 414/591 |
| 4,108,578 A | * | 8/1978 | Corey | 417/331 |
| 4,781,511 A | * | 11/1988 | Harada et al. | 414/217.1 |
| 4,811,617 A | * | 3/1989 | Whiteman, Jr. | 74/422 |
| 4,951,601 A | * | 8/1990 | Maydan et al. | 700/248 |
| 5,020,475 A | * | 6/1991 | Crabb et al. | 118/719 |
| 5,076,205 A | * | 12/1991 | Vowles et al. | 701/208 |
| 5,288,379 A | * | 2/1994 | Namiki et al. | 318/568.11 |
| 5,310,410 A | * | 5/1994 | Begin et al. | 29/25.1 |
| 5,807,062 A | | 9/1998 | Schultz et al. | |
| 6,085,125 A | * | 7/2000 | Genov | 118/719 |

FOREIGN PATENT DOCUMENTS

| | | |
|---|---|---|
| JP | 3-266451 A | 11/1991 |
| JP | 6-104330 A | 4/1994 |
| JP | 9-186061 A | 7/1997 |

OTHER PUBLICATIONS

Koppelman, Oyster, a 3D structural simulator for micro electromechanical design, 1989, IEEE, pp. 88–93.*

* cited by examiner

*Primary Examiner*—William A. Cuchlinski, Jr.
*Assistant Examiner*—McDieunel Marc
(74) *Attorney, Agent, or Firm*—Frishauf, Holtz, Goodman & Chick, P.C.

(57) ABSTRACT

An alignment apparatus which obtains an amount of correction for centering a semiconductor wafer from four points of a wafer edge detected by noncontact proprioceptors in a wafer delivery position $P_1$ where the semiconductor wafer is passed to a wafer carrying unit from a wafer carrying robot and centers the semiconductor wafer.

9 Claims, 6 Drawing Sheets

ALIGNMENT APPARATUS

CROSS REFERENCE TO RELATED APPLICATIONS

This is a Continuation Application of PCT Application No. PCT/JP01/07984, filed Sep. 14, 2001, which was not published under PCT Article 21(2) in English.

This application is based upon and claims the benefit of priority from the prior Japanese Patent Application No. 2000-280884, filed Sep. 14, 2000, the entire contents of which are incorporated herein by reference.

BACKGROUND OF THE INVENTION

1. Field of the Invention

The present invention relates to an alignment apparatus for aligning a semiconductor wafer in a predetermined position.

2. Description of the Related Art

A substrate inspection apparatus inspects the surface of a semiconductor wafer and detects a defect on the surface of the semiconductor wafer if any. The defect on the surface of the semiconductor wafer is, for example, a flaw, a chip, surface unevenness, dirt, and dust.

The substrate inspection apparatus comprises a wafer carrier for storing a plurality of semiconductor wafers, an inspection unit for performing a macro-inspection to visually inspect a semiconductor wafer and a micro-inspection to enlarge the surface of a semiconductor wafer using a microscope and inspect it, and a loader unit for removing a semiconductor wafer from the wafer carrier, passing the semiconductor wafer to the inspection unit, receiving the semiconductor wafer whose inspection has been completed in the inspection unit, and returning the wafer to the wafer carrier.

The inspection unit includes a wafer carrying apparatus for circularly carrying the semiconductor wafer received from the loader unit to a position of the macro-inspection and then that of the micro-inspection.

In the macro-inspection, a semiconductor wafer is rotated and rocked by a rocking mechanism to irradiate the surface of the semiconductor wafer with illumination for the macro-inspection. An inspector visually observes light reflected and scattered from the semiconductor wafer and detects a defect thereon.

In the micro-inspection, the defect on the surface of the semiconductor wafer, which has been detected by the macro-inspection, is enlarged using a microscope. An image of the enlarged defect is picked up by, for example, an image pickup device and displayed on a monitor. Thus, the inspector observes the type and size of the defect.

In the macro-inspection, however, the inspector visually observes a semiconductor wafer that is being rotated and rocked; therefore, it is difficult for the inspector to detect a defect if the semiconductor wafer is decentered and rotated.

It is thus necessary to lessen a decentering operation of the semiconductor wafer when the wafer is rotated and rocked.

For this reason, the semiconductor wafer is usually centered and passed to the inspection unit.

The centering method is executed as follows:

A case where an orthogonal robot is used in the loader unit will be described. The orthogonal robot includes an arm moving in the x-axis direction and an arm moving in the y-axis direction that intersects the x-axis direction at right angles.

The orthogonal robot removes a semiconductor wafer from the wafer carrier and passes it to the inspection unit. To perform the centering, when the semiconductor wafer crosses a plurality of sensors arranged on a wafer carrying path (before the wafer carrier), the sensors detect four points of the edge of the semiconductor wafer and obtains an amount of displacement of the semiconductor wafer from the center based on edge information of three of the four points.

When the semiconductor wafer is passed to the inspection unit, the amount of displacement of the semiconductor wafer from the center is corrected and the center of the wafer is aligned.

If an orthogonal robot is used in the loader unit that carries a semiconductor wafer from the wafer carrier to the inspection unit, a large space for moving the X and Y arms is required.

An articulated wafer-carrying robot is used in the inspection apparatus set up in a clean room since it is demanded that the carrying speed of semiconductor wafers and the setup space of the loader unit should be decreased.

The articulated wafer-carrying robot performs an operation for rotating an articulated arm, an operation for expanding and contracting the articulated arm to advance and retreat a hand, and an operation for lifting and lowering the articulated arm.

In the articulated wafer-carrying robot, however, a plurality of articulated arms are expanded, contracted and rotated, which complicates the control of an operation for aligning a semiconductor wafer. Furthermore, the distance from the position where an amount of displacement of the wafer from the center is obtained before the wafer carrier to the position of a delivery station of the inspection unit is long, and the articulated arms are rotated in the direction of the wafer carrier and that of the delivery station. It is thus difficult to center the semiconductor wafer with high precision.

BRIEF SUMMARY OF THE INVENTION

An object of the present invention is to provide an alignment apparatus capable of aligning a target object such as a semiconductor wafer in a predetermined position.

An alignment apparatus according to the present invention, which aligns a target object in a predetermined position, comprises a carrying robot which carries the target object stored in a storage case to a delivery position of an installed apparatus, at least two optical sensors provided in the delivery position, which detects an outer circumference of the target object, moving means for moving the optical sensors and the target object relatively to each other to cause the outer circumference of the target object to fall within a field of view of the optical sensors, and alignment control unit which controls the carrying robot based on information of at least three points of the outer circumference detected by the optical sensors to align the target object in the predetermined position.

In an alignment apparatus according to another aspect of the present invention, the optical sensors are fixedly arranged at four points of the outer circumference of a largest-diameter one of a plurality of target objects with regard to a normal center of the delivery position, and the moving means positions an edge of the target object in each of the optical sensors.

In an alignment apparatus according to another aspect of the present invention, the optical sensors are fixedly arranged at four points on concentric circles corresponding to the outer circumferences of a plurality of target objects having different outside diameters with regard to a normal center of the delivery position.

In an alignment apparatus according to another aspect of the present invention, the moving mechanism moves the at least two optical sensors to respective points corresponding to outer circumferences of a plurality of target objects having different outside diameters.

In an alignment apparatus according to another aspect of the present invention, the optical sensors are arranged at four points on concentric circles with regard to a normal center of the delivery position, and the moving means moves the four optical sensors to positions on concentric circles corresponding to edges of a plurality of target objects having different outside diameters.

In an alignment apparatus according to another aspect of the present invention, the optical sensors are arranged in a position where concentric circles corresponding to the outer circumference of the target object having a largest outside diameter with regard to a normal center of the delivery position intersect the outer circumference of the target object having a small outside diameter.

In an alignment apparatus according to another aspect of the present invention, the moving mechanism is an articulated carrying robot comprising a rotating shaft that is rotatable in an axial direction, a plurality of joint arms coupled to each other to form an articulated arm, one end of the joint arms being provided on the rotating shaft, and a hand which is coupled to another end of the joint arms and holds the target object.

In an alignment apparatus according to another aspect of the present invention, the optical sensors comprise a two-dimensional image pickup device including an incident-light telecentric illumination system and obtains positional information of the outer circumference of the target object detected by the optical sensors from image data on one line or plural lines in a direction perpendicular to the outer circumference based on a two-dimensional image of the outer circumference of the target object.

In the alignment apparatus of the present invention configured as described above, when a target object stored in the storage case is carried to the delivery position of the installed apparatus by the carrying robot, at least two optical sensors are provided at the delivery position, these optical sensors are moved relatively to the target object, the outer circumference of the target is caused to fall within a field of view of each of the optical sensors, and the carrying robot is controlled based on information of at least three points of the outer circumference detected by the optical sensors, thereby aligning the target object in a predetermined position.

DETAILED DESCRIPTION OF THE INVENTION

A first embodiment of the present invention will now be described with reference to the accompanying drawings.

Figure 1:
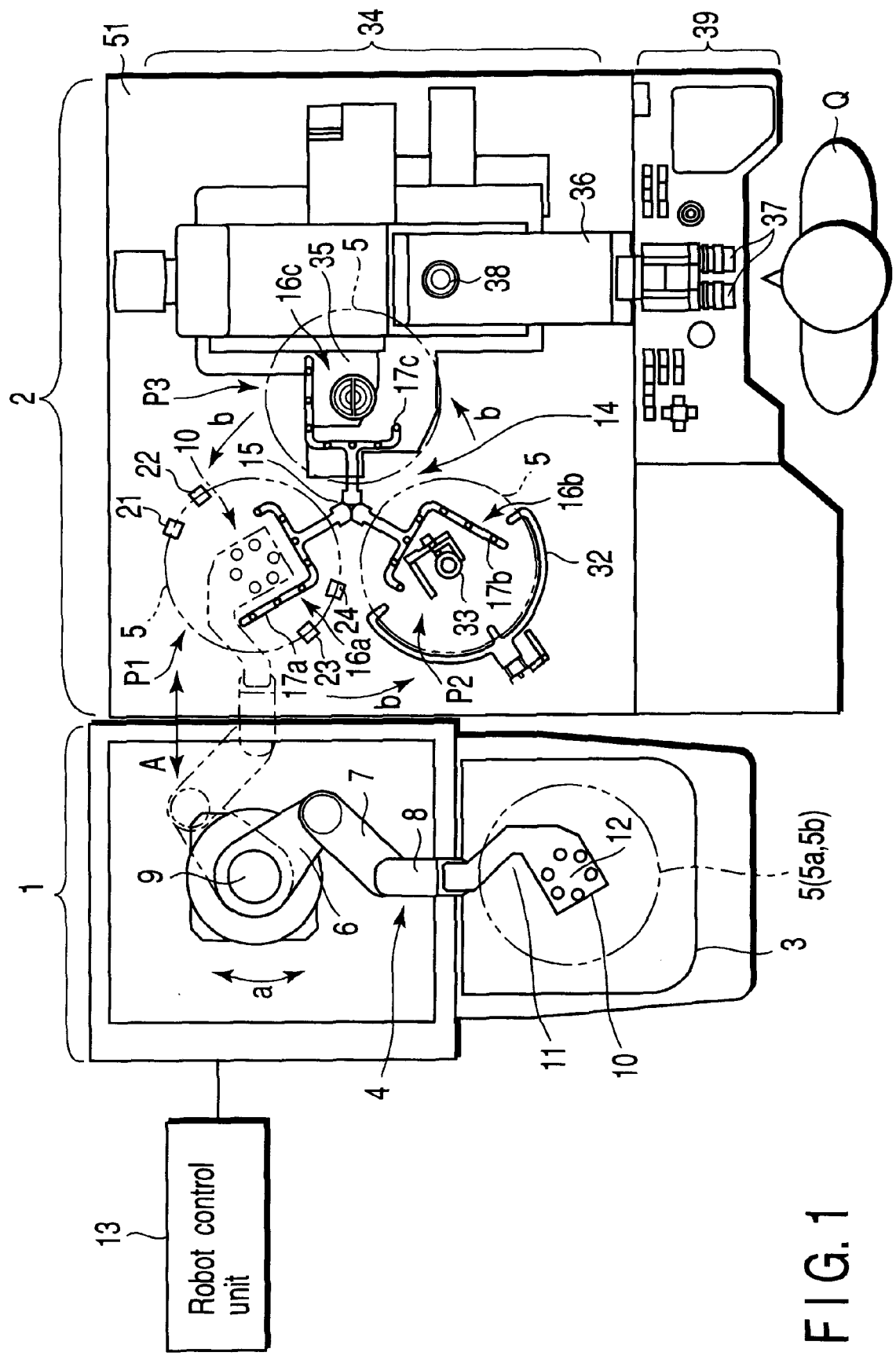
FIG. 1 is a view showing a configuration of a wafer inspection apparatus using an alignment apparatus according to a first embodiment of the present invention.

FIG. 1 is a view showing a configuration of a wafer inspection apparatus using an alignment apparatus of the present invention. The wafer inspection apparatus is composed chiefly of a loader unit 1 and an inspection unit 2.

The loader unit 1 and inspection unit 2 are provided separately from each other. The loader unit 1 is arranged on the left side and the inspection unit 2 is arranged on the left side when viewed from the front F.

The loader unit 1 includes a wafer carrier 3 and a wafer-carrying robot 4. The wafer carrier 3 stores a plurality of semiconductor wafers up and down at given pitches. Of these semiconductor wafers 5, uninspected semiconductor wafers 5 are referred to as semiconductor wafers 5a and inspected semiconductor wafers 5 are referred to as semiconductor wafers 5b.

The wafer-carrying robot 4 removes the uninspected semiconductor wafers 5a from the wafer carrier 3 and passes them to the inspection unit 2. On the other hand, the robot 4 receives the inspected semiconductor wafers b from the inspection unit 2 and stores them in the wafer carrier 3.

The wafer-carrying robot 4 is an articulated robot. The wafer-carrying robot 4 includes an articulated arm having three joint arms 6 to 8 jointed to each other. Of these joint arms 6 to 8, the joint arm 6 at one end is connected to a rotating shaft 9. The rotating shaft 9 rotates about its axis in the direction of arrow a.

A hand 10 is connected to the joint arm 8 at the other end. The hand 10 adsorbs and holds the semiconductor wafers 5. The hand 10 includes a relief section 11 and an adsorption section 12.

A robot control unit 13 controls an operation of the wafer-carrying robot 4. In other words, the robot control unit 13 rotates the articulated arm around the rotating shaft 9 in the direction of arrow a and the respective joint arms 6 to 8 are expanded and contracted to advance and retreat the hand 10.

The inspection unit 2 performs a macro-inspection and a micro-inspection. In the macro-inspection, a semiconductor wafer 5 is visually observed to detect a defect on the surface of the semiconductor wafer 5. The defect is, for example, a flaw, a chip, surface unevenness, dirt, and dust.

In the micro-inspection, the defect on the surface of the semiconductor wafer 5, which was detected by the macro-inspection, is enlarged using a microscope to acquire the type and size of the defect.

A wafer carrying unit 14 is provided on a pedestal of the inspection unit 2. The wafer carrying unit 14 includes a rotating shaft 15 and three carrying arms 16a, 16b and 16c arranged at equal angles (e.g., 120 degrees) relative to the rotating shaft 15.

These carrying arms 16a, 16b and 16c are formed as L-shaped hands 17a, 17b and 17c, respectively. These L-shaped hands 17a, 17b and 17c each have a long finger 18 and a short finger 19 relatively to each other as shown in FIG. 2.

A plurality of adsorption holes (wafer chucks) 20 are formed in each of the L-shaped hands 17a, 17b and 17c. These adsorption holes 12 are connected to a suction device such as a suction pump.

Figure 2:
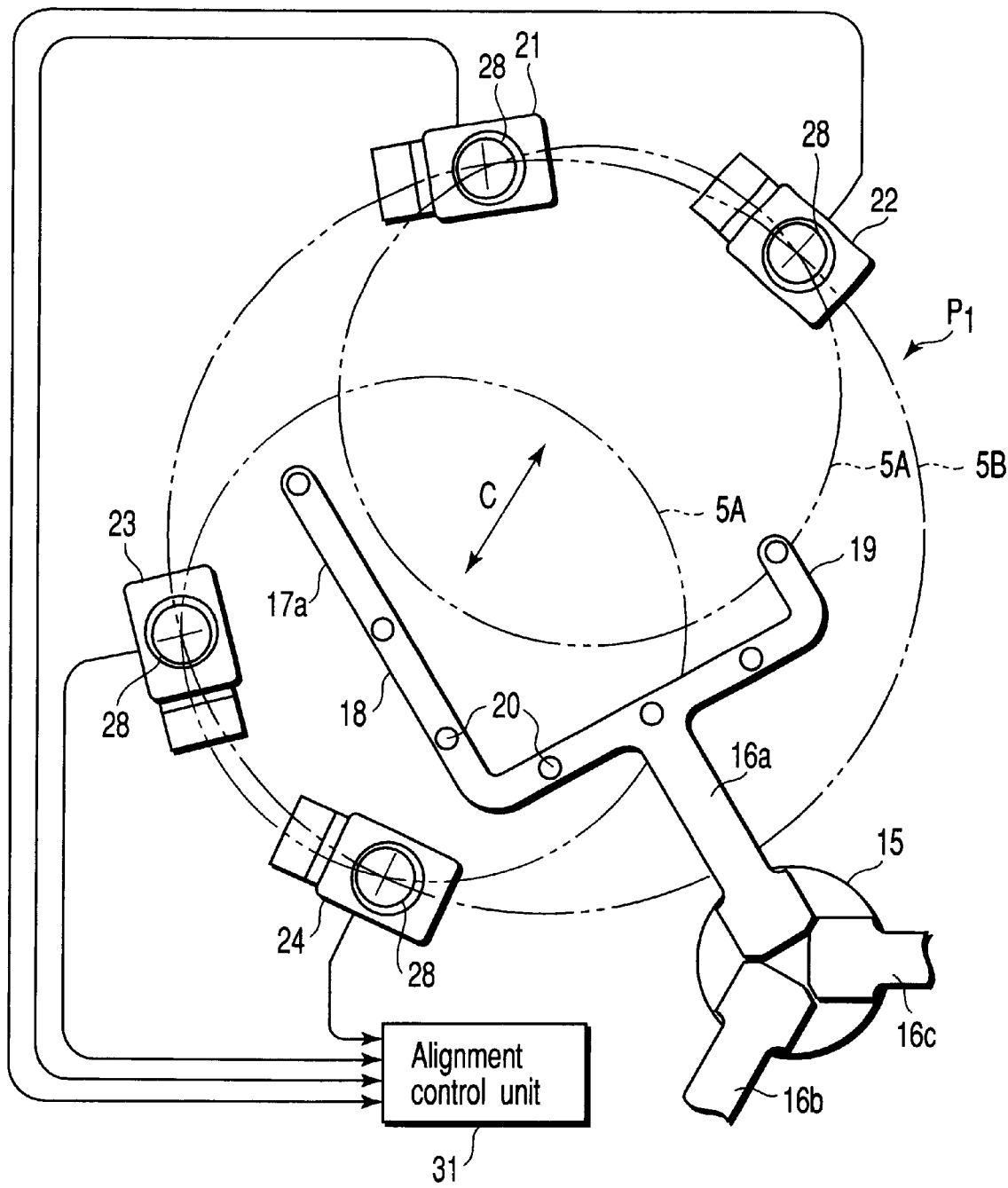
FIG. 2 is a view showing an arrangement of respective no contact proprioceptors in the alignment apparatus according to the first embodiment of the present invention.

FIG. 2 shows only the L-shaped hand 17a. However, the other L-shaped hands 17b and 17c have the same structure as that of the L-shaped hand 17a and thus their descriptions are omitted.

The wafer-carrying unit 14 rotates about the rotating shaft 15 counterclockwise (in the direction of arrow b). Thus, the three carrying arms 16a, 16b and 16c circularly move to a wafer delivery position $P_1$, a macro-inspection position $P_2$, and a micro-inspection delivery position $P_3$, respectively.

In the wafer delivery position $P_1$, the semiconductor wafers 5 are delivered between the wafer carrying robot 4 and the wafer-carrying unit 14.

In the wafer-carrying unit 14, one of the three carrying arms 16a, 16b and 16c, which correspond to, e.g., the carrying arm 17a shown in FIG. 1, is positioned.

Then, the wafer-carrying robot 4 performs the following operation under the control of the robot control unit 13. The wafer-carrying robot 4 expands the articulated arm and puts the hand 10 into the L-shaped hand 17a of the carrying arm 16a. The wafer-carrying robot 4 lowers the hand 10, which holds the semiconductor wafer 5, into the L-shaped hand 17a from thereabove, with the result that the semiconductor wafer 5 is passed to the L-shaped hand 17a.

The center of the wafer delivery position $P_1$ falls within a carrying stroke range of the wafer-carrying robot 4.

As shown in FIG. 2, four noncontact proprioceptors (optical sensors) 21 to 24 are provided in the wafer delivery position $P_1$. These noncontact proprioceptors 21 to 24 are used for aligning the semiconductor wafers 5. The noncontact proprioceptors 21 to 24 are fixedly provided on the pedestal of the inspection unit 2 under the L-shaped hand 17a, 17b or 17c positioned in the wafer delivery position $P_1$.

The four noncontact proprioceptors 21 to 34 are arranged in their respective positions corresponding to the outer circumferences (referred to as wafer edges hereinafter) of a plurality of semiconductor wafers 5 having different outside diameters, e.g., a semiconductor wafer 5A having an outside diameter of 200 mm and a semiconductor wafer 5B having an outside diameter of 300 mm.

More specifically, the four noncontact proprioceptors 21 to 24 are arranged on a concentric circle whose edge corresponds to that of the semiconductor wafer 5B having an outside diameter of 300 mm in the wafer delivery position $P_1$.

These noncontact proprioceptors 21 to 24 compose a pair of noncontact proprioceptors 30 and 31 and a pair of noncontact proprioceptors 32 and 33.

When the semiconductor wafer 5A having an outside diameter of 200 mm or the semiconductor wafer 5B having an outside diameter of 300 mm is passed to the L-shaped hand 17a, 17b or 17c from the hand 10, the robot control unit 13 controls the operation of the wafer carrying robot 4 as follows.

More specifically, when the semiconductor wafer 5A having an outside diameter of 200 mm is passed to the L-shaped hand 17a, 17b or 17c from the hand 10, the wafer carrying robot 4 reciprocates the articulated arm and hand 10 in the directions of arrow c shown on FIG. 2, and positions the wafer wedge of the semiconductor wafer 5A, which is held on the hand 10, above the noncontact proprioceptors 21 and 22 and the noncontact proprioceptors 23 and 24.

For example, the wafer carrying robot 4 first positions the wafer edge of the semiconductor wafer 5A above one pair of noncontact proprioceptors 21 and 22.

Then, the wafer-carrying robot 4 positions the wafer edge of the semiconductor wafer 5A above another pair of noncontact proprioceptors 23 and 24.

When the semiconductor wafer 5B having an outside diameter 300 mm is passed to the L-shaped hand 17a, 17b or 17c from the hand 10, the wafer carrying robot 4 moves the articulated arm and hand 10 and positions the semiconductor wafer 5B such that the wafer edge of the semiconductor wafer 5B falls within the field of view of detection of all the four noncontact proprioceptors 21 to 24 at the same time.

An interval between the paired noncontact proprioceptors 21 and 22 and an interval between the paired noncontact proprioceptors 23 and 24 are each greater than the span of orientation flat of the semiconductor wafer 5A having an outside diameter of 200 mm or the width of a neck of the hand 10.

Figure 3:
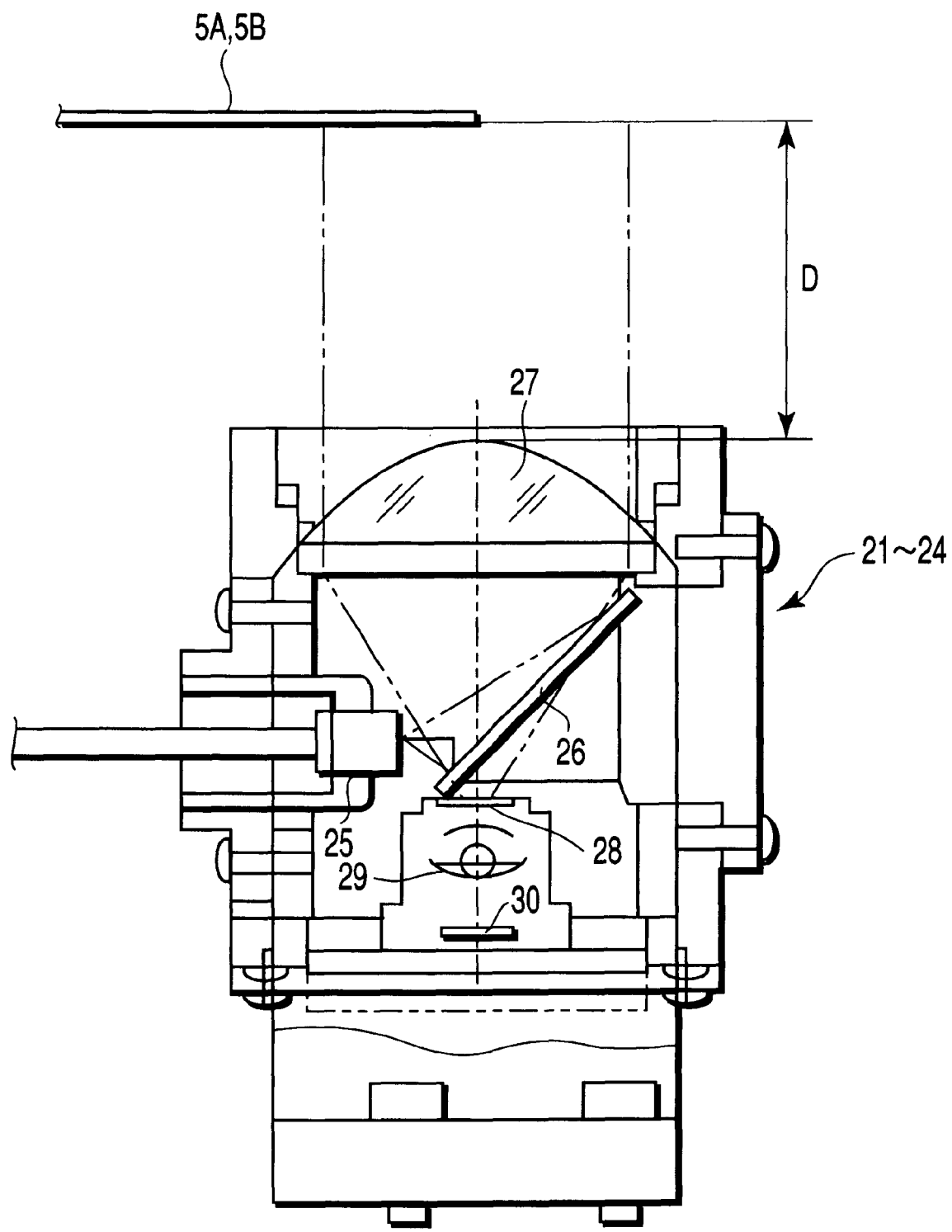
FIG. 3 is a view specifically showing an arrangement of the noncontact proprioceptors in the alignment apparatus according to the first embodiment of the present invention.

FIG. 3 is a view specifically showing an arrangement of the noncontact proprioceptors 21 to 24. These noncontact proprioceptors 21 to 24 employ an incident-light telecentric illumination image-forming optical system.

A light source is a light-emitting diode (LED) 25. The LED 25 emits LED light. A half mirror 26 is provided on an optical path of the LED Light as an optical path splitting element. A convex lens 27 is provided on an optical path of light reflected by the half mirror 26.

The convex lens 27 has a function of a collimate lens and a function of a condenser.

More specifically, the convex lens 27 shapes the LED light emitted from the LED 25 into collimated light and irradiates the wafer edge of the semiconductor wafer 5A or 5B with the collimated light (function of the collimate lens).

The convex lens 27 condenses the LED light reflected by the wafer edge of the semiconductor wafer 5A or 5B (function of the condenser).

An iris 28, a lens 29, and a detection element 30 are provided on an optical path of light condensed by the convex lens 27. The iris 28 is formed like a circle.

The detection element 30 includes a plurality of solid-state image pickup elements (CCD) arranged two-dimensionally. For example, CMOS is used as the CCD.

The detection element 30 picks up an image of the LED light reflected by the wafer edge of the semiconductor wafer 5A or 5B and outputs a two-dimensional image signal.

The alignment control unit 31 receives image signals from the four noncontact proprioceptors 21 to 24 and creates their corresponding image data. Of the image data, the unit 31 extracts image data (hereinafter referred to as line image data) of CCD on one or plural lines in a direction perpendicular to the wafer edge of the semiconductor wafer 5A or 5B and determines four detecting positions (coordinates) of the wafer edge of the semiconductor wafer 5A or 5B based on the line image data. In this case, it is image signals that are output from the CCD; therefore, the detecting positions of the wafer edge are easily obtained from the number of pixels.

The alignment control unit 31 obtains information of three wafer edge positions (coordinates) that do not contain at least orientation flat or notch information from the detecting positions of the wafer edge of the semiconductor wafer 5A or 5B and thus obtains the center of the semiconductor wafer 5A or 5B from the coordinates.

The center of the semiconductor wafer 5A or 5B is obtained by a known method for obtaining the center of the coordinates of a circle.

The alignment control unit 31 compares the center of the semiconductor wafer 5A or 5B with a normal center (the center of wafer delivery position $P_1$) to obtain an amount of displacement of the center of the semiconductor wafer 5A or 5B from the normal center.

The amount of displacement obtained by the alignment control unit 31 is sent to the robot control unit 13. The robot control unit 13 obtains an amount of correction for centering from the amount of displacement and gives an instruction of the amount of correction to the wafer-carrying robot 4.

Based on the amount of correction, the wafer-carrying robot 4 aligns the semiconductor wafer 5A or 5B such that the center of the semiconductor wafer coincides with the normal center.

A macro-inspection shaking mechanism 32 and a macro-inspection rotating mechanism 33 are provide in the macro-inspection position $P_2$ on the pedestal of the inspection unit 2.

While the macro-inspection shaking mechanism 32 is shaking the semiconductor wafer 5, an inspector Q visually observes the surface and undersurface of the wafer.

The semiconductor wafer 5 held by the macro-inspection shaking mechanism 32 is irradiated with illumination for macro-observation at a predetermined angle.

The macro-inspection rotating mechanism 33 rotates the semiconductor wafer 5 and moves it up and down.

The micro-inspection unit 34 is provided on the pedestal of the inspection unit 2. The micro inspection unit 34 receives the semiconductor wafer 5 held on the hand 17a, 17b or 17c positioned in the micro-inspection delivery position $P_3$.

The micro-inspection unit 34 includes a stage 35 and a microscope 36. The stage 35 adsorbs and holds the semiconductor wafer 5 and moves the semiconductor wafer 5.

The microscope 36 enlarges an image of the surface of the semiconductor wafer 5 adsorbed and held on the stage 35, and the enlarged image is observed by an eyepiece 37.

An image pickup device 38 such as a CCD is attached to the microscope, and the image is displayed on a monitor of the device 38.

An operation unit 39 is provided on the front of the inspection unit 2. The operation unit 39 performs an operation of making a macro-inspection and a micro-inspection, an operation of inputting results of these inspections, and an operation of inputting various types of data such as data on the operation of the entire inspection apparatus.

A function of the apparatus having the above configuration will now be described.

First, for example, the hand 17a of the wafer carrying unit 14 is positioned in the wafer delivery position $P_1$. The hand 17b is positioned in the macro-inspection position $P_2$. The L-shaped hand 17c is positioned in the micro-inspection delivery position $P_3$.

In the wafer delivery position $P_1$, the wafer carrying robot 4 rotates about the rotating shaft 9 and turns the articulated arm in which direction the wafer carrier 3 is provided.

Then, the wafer carrying robot 4 expands the respective joint arms 6 to 8 and adsorbs and hold the uninspected semiconductor wafer 5a stored in the wafer carrier 3.

Then, the wafer carrying robot 4 contracts the respective joint arms 6 to 8 and the hand 10, after that, the robot 4 rotates 90 degrees, e.g., in a counterclockwise direction and stops, and turns the articulated arm to the wafer delivery position $P_1$ of the inspection unit 2.

Then, the wafer carrying robot 4 expands the respective joint arms 6 to 8 and the hand 10 in the direction of arrow A again, and inserts the articulated arm into the inspection unit 2 from its left-hand sidewall and stops it above the wafer delivery position $P_1$.

Then, when the semiconductor wafer 5A having an outside diameter of 200 mm or the semiconductor wafer having an outside diameter of 300 mm is passed to the L-shaped hand 17a, 17b or 17c from the hand 10, the robot control unit 13 controls the operation of the wafer carrying robot 4 as follows.

When the semiconductor wafer 5A having an outside diameter of 200 mm is passed to the L-shaped hand 17a from the hand 10, 17b or 17c, the wafer carrying robot 4 moves the articulated arm and hand 10 and then moves the position of the semiconductor wafer 5A held on the hand 10 in the direction of arrow c.

For example, in the wafer carrying robot 4, the wafer edge of the semiconductor wafer 5A is first positioned above one pair of noncontact proprioceptors 21 and 22 and then the wafer edge of the semiconductor wafer 5A is positioned above another pair of noncontact proprioceptors 23 and 24.

At this time, the noncontact proprioceptors 21 and 22 detect the wafer edge of the semiconductor wafer 5A and output respective image signals.

Then, the noncontact proprioceptors 23 and 24 detect the wafer edge of the semiconductor wafer 5A and output respective image signals.

On the other hand, when the semiconductor wafer 5B having an outside diameter of 300 mm is passed to the L-shaped hand 17a, 17b or 17c from the hand 10, the wafer carrying robot 4 moves the articulated arm and hand 10 and positions the semiconductor wafer 5B such that the wafer edge of the semiconductor wafer 5B falls within the field of view of detection of all the four noncontact proprioceptors 21 to 24 at the same time.

The noncontact proprioceptors 21 to 24 detect the wafer edge of the semiconductor wafer 5A simultaneously and output their respective image signals.

The operation of these noncontact proprioceptors 21 to 24 is performed as follows.

The four noncontact proprioceptors 21 to 24 emit LED light from the LED 25.

The LED light is reflected by the half mirror 26 and shaped into collimated light by the convex lens 27. The wafer edge of the semiconductor wafer 5A or 5B is irradiated with the collimated light.

The light reflected by the wafer edge enters the convex lens 27 again. The light reflected by the wafer edge is condensed by the concave lens 27 and enters a detection element 30 through the iris 28 and lens 29.

The detection element 30 picks up an image of the wafer edge of the semiconductor wafer 5A or 5B and outputs the image as an image signal.

Then, the alignment control unit 31 receives image signals from the four noncontact proprioceptors 21 to 24 and creates their corresponding image data. From the image data, the unit 31 extracts line image data of CCD on one line in a direction perpendicular to the wafer edge of the semiconductor wafer 5A or 5B and determines four detecting positions of the wafer edge of the semiconductor wafer 5A or 5B based on the line image data.

Then, the alignment control unit 31 obtains coordinates of three of the detecting positions of the wafer edge of the semiconductor wafer 5A or 5B, which do not contain at least orientation flat or notch information and thus obtains the center of the semiconductor wafer 5A or 5B from the coordinates.

Then, the alignment control unit 31 compares the center of the semiconductor wafer 5A or 5B with a normal center to obtain an amount of displacement of the center of the semiconductor wafer 5A or 5B from the normal center.

Then, the alignment control unit 31 obtains an amount of correction for centering from the amount of displacement and gives an instruction of the amount of correction to the wafer carrying robot 4.

Based on the amount of correction, the wafer carrying robot 4 moves the articulated arm and hand 10 and aligns the center of the semiconductor wafer 5A or 5B held on the hand 10.

Consequently, the center of the semiconductor wafer 5A or 5B coincides with the normal center. In other words, the semiconductor wafer 5A or 5B is centered.

Then, the wafer carrying robot 4 releases its adsorption to the semiconductor wafer 5A and passes the semiconductor wafer 5A on the hand 10 to the L-shaped hand 17a.

In other words, the wafer carrying robot 4 puts the hand 10, which holds the semiconductor wafer 5A, above the L-shaped hand 17a and then lowers and passes the semiconductor wafer 5A to the L-shaped hand 17a.

In the macro-inspection position $P_2$, the semiconductor wafer 5A adsorbed and held on the L-shaped hand 17b is passed to the macro-inspection shaking mechanism 32.

In the micro-inspection position $P_3$, the micro-inspection unit 34 receives the semiconductor wafer 5a held on the L-shaped hand 17c and places it on the stage 35.

When the micro-inspection is completed, the micro-inspection unit 34 carries out the inspected semiconductor wafer 5b and passes it onto the L-shaped hand 17c.

When the macro-inspection and micro-inspection are completed, the wafer carrying unit 14 rotates again about the rotating shaft 15, e.g., in a counter-clockwise direction on the drawing.

Thus, the L-shaped hand 17a of the wafer carrying unit 14 is positioned in the macro-inspection position $P_2$, and the L-shaped hand 17b is positioned in the micro-inspection delivery position $P_3$. The L-shaped hand 17c is positioned in the wafer delivery position $P_1$.

After that, the delivery of the semiconductor wafers 5 is performed in the wafer delivery position $P_1$. In this wafer delivery position $P_1$, the alignment of the semiconductor wafer 5a is performed.

The macro-inspection is performed in the macro-inspection position $P_2$. The micro-inspection is performed in the micro-inspection delivery position $P_3$.

According to the first embodiment described above, an amount of correction for centering the semiconductor wafer 5A or 5B is obtained from the four points of the wafer edge of the semiconductor wafer 5A or 5B detected by the noncontact proprioceptors 21 to 24 in the wafer delivery position $P_1$ in which the semiconductor wafer 5A or 5B is passed to the wafer carrying unit 14 from the wafer carrying robot 4, and the semiconductor wafer 5A or 5B is centered in the same wafer delivery position $P_1$.

Consequently, the wafer carrying robot 4 performs an operation of rotating the articulated arm, an operation of expanding and contracting the articulated arm to advance and retract the position of the hand, and an operation of lifting and lowering the articulated arm.

Even though the wafer carrying robot 4 is used, an amount of correction for centering a plurality of types of semiconductor wafers 5A or 5B having different radii can be obtained through a simple operation.

Thus, a decentering operation of the semiconductor wafers 5, which is performed at the time of macro-inspection, can be lessened. Macro-observation efficiency is improved.

When the semiconductor wafer 5 is passed to the micro-inspection unit 34, it can be caused to fall within a given alignment range or an alignment range in the stage 35 of the micro-inspection unit 34. The alignment time in the micro-inspection unit 34 can be shortened.

The four noncontact proprioceptors 21 to 24 are arranged in positions corresponding to the wafer edge of the semiconductor wafer 5B having an outside diameter of 300 mm. The two noncontact proprioceptors 21 and 22 are paired and so are the other two noncontact proprioceptors 23 and 24.

In the case of the semiconductor wafer 5A whose outside diameter is 200 mm, the wafer carrying robot 4 reciprocates the hand 10, which holds the semiconductor wafer 5A, in the directions of arrow c, and positions it in the pair of noncontact proprioceptors 21 and 22 and the other pair of noncontact proprioceptors 23 and 24.

In the present apparatus, therefore, the semiconductor wafers 5A and 5B whose outside diameters are 200 mm and 300 mm, respectively can be centered.

The alignment operation of the semiconductor wafers 5A and 5B can be performed during a series of carrying operation immediately before the semiconductor wafers 5A and 5B are delivered. Even though one of the semiconductor wafer 5A having an outside diameter of 200 mm or the semiconductor wafer 5B having an outside diameter of 300 mm is carried, the alignment operation can be performed for the carried semiconductor wafer 5A or 5B.

The four noncontact proprioceptors 21 to 24 employ an incident-light telecentric illumination image-forming optical system. Since these noncontact proprioceptors 21 to 24 are small and compact, they do not have an influence on the operations of the wafer carrying robot 4 and wafer carrying unit 14.

The noncontact proprioceptors 21 to 24 can be arranged under the semiconductor wafer 5. The noncontact proprioceptors 21 to 24 do not prevent a downflow in semiconductor manufacturing facilities since neither a phototransmitter nor a photoreceiver is provided above the semiconductor wafer 5.

Since the noncontact proprioceptors 21 to 24 use telecentric illumination, they can always detect a wafer edge of the semiconductor wafer 5A or 5B correctly even though a distance D between each of the noncontact proprioceptors 21 to 24 and the semiconductor wafer 5A or 5B varies as shown in FIG. 3.

Of CCD image signals output from the four noncontact proprioceptors 21 to 24, one- or plural-line image data is used; therefore, the image processing speed at which the wafer edge of the semiconductor wafer 5A or 5B is detected is increased. The time for macro-inspection and micro-inspection of the semiconductor wafers 5 is shortened.

A second embodiment of the present invention will now be described.

In the second embodiment, the configuration of the alignment apparatus according to the above-described first embodiment is changed.

Since a loader unit 1 and an inspection unit 2 are the same as the loader unit 1 and inspection unit 2 of the first embodiment, their descriptions in configuration and function are omitted to avoid overlaps.

Figure 4:
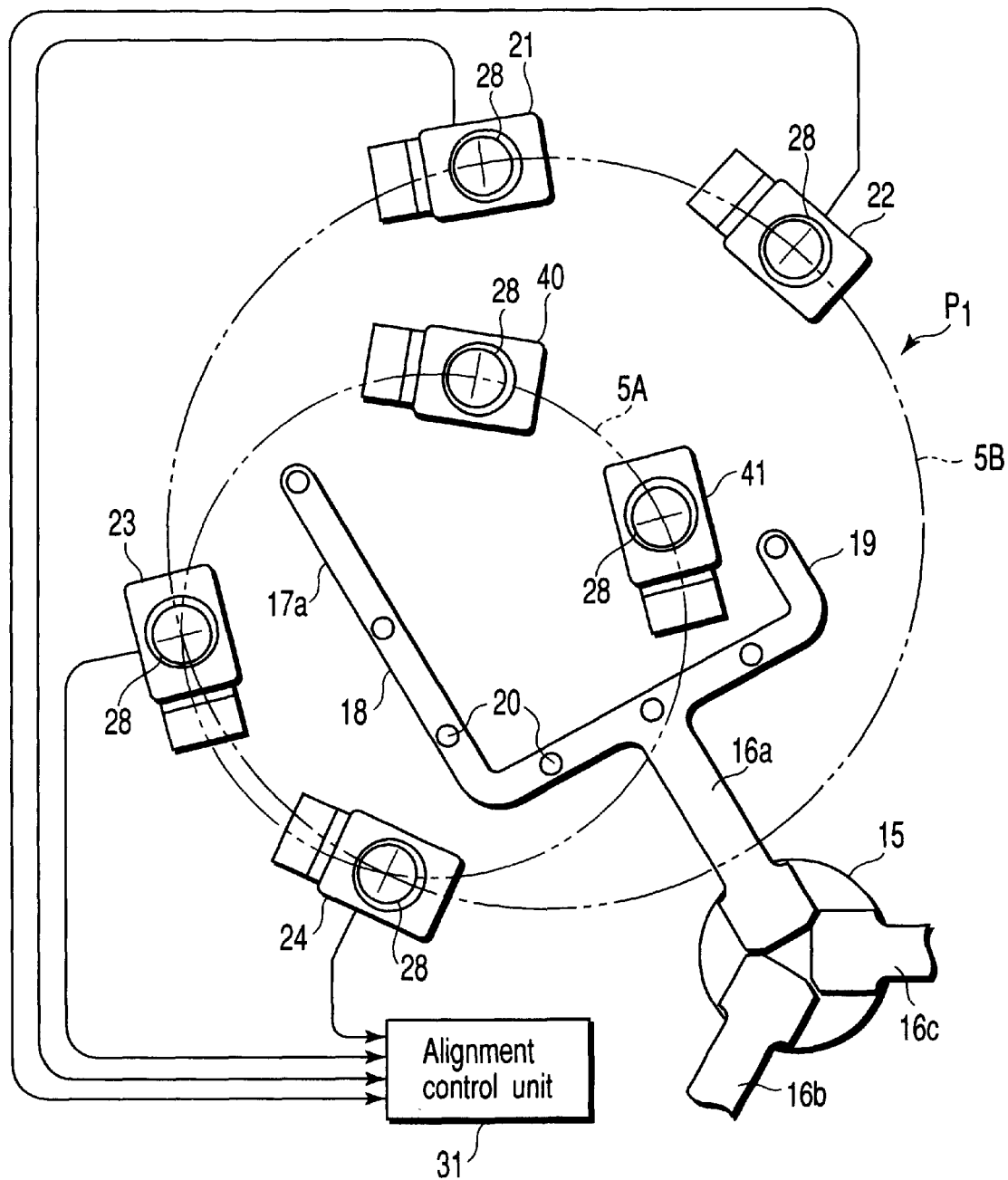
FIG. 4 is a view specifically showing an arrangement of noncontact proprioceptors in an alignment apparatus according to a second embodiment of the present invention.

FIG. 4 is a view specifically showing an arrangement of noncontact proprioceptors of the alignment apparatus according to the second embodiment of the present invention.

Two noncontact proprioceptors 40 and 41 are fixedly arranged where a semiconductor wafer 5A having an outside diameter of 200 mm is positioned.

These noncontact proprioceptors 40 and 41 have the same configuration as that of the noncontact proprioceptors 21 to 24 shown in FIG. 3.

Thus, the noncontact proprioceptors 23 and 24 serve to detect a wafer edge of each of the semiconductor wafer 5A having an outside diameter of 200 mm and a semiconductor wafer 5B having an outside diameter of 300 mm.

The noncontact proprioceptors 21 and 22 serve only to detect the semiconductor wafer 5B having an outside diameter of 300 mm.

The noncontact proprioceptors 40 and 41 serve only to detect the semiconductor wafer 5A having an outside diameter of 200 mm.

When the semiconductor wafer 5A having an outside diameter of 200 mm or the semiconductor wafer 5B having an outside diameter of 300 mm is passed to the L-shaped hand 17a, 17b or 17c from the hand 10, the robot control unit 13 controls the operation of the wafer carrying robot 4 as follows.

More specifically, when the semiconductor wafer 5A having an outside diameter of 200 mm is passed to the L-shaped hand 17a, 17b or 17c from the hand 10, the wafer carrying robot 4 moves the articulated arm and hand 10 and positions the semiconductor wafer 5A, which is held on the hand 10, above the four noncontact proprioceptors 23, 24, 40 and 41.

When the semiconductor wafer 5B having an outside diameter of 300 mm is passed to the L-shaped hand 17a, 17b or 17c from the hand 10, the wafer carrying robot 4 moves the articulated arm and hand 10 and positions the semiconductor wafer 5B, which is held on the hand 10, above the four noncontact proprioceptors 21 to 24.

The alignment control unit 31 has the following functions. When the semiconductor wafer 5A having an outside diameter of 200 mm is passed to the L-shaped hand 17a, 17b or 17c from the hand 10, the alignment control unit 31 receives image signals output from the four noncontact proprioceptors 23, 24, 40 and 41 to create their corresponding image data, and extracts one-line image data in the direction perpendicular to the wafer edge of the semiconductor wafer 5A based on the image data to obtain four detecting positions of the wafer edge of the semiconductor wafer 5A from the line image data.

The alignment control unit 31 obtains coordinates of three of the detecting positions of the wafer edge of the semiconductor wafer 5A, which do not contain at least orientation flat or notch information, and obtains the center of the semiconductor wafer 5A from the coordinates.

The alignment control unit 31 compares the center of the semiconductor wafer 5A and a normal center with each other to obtain an amount of displacement of the center of the semiconductor wafer 5A from the normal center.

The alignment control unit 31 obtains an amount of correction for centering from the amount of displacement and gives an instruction of the amount of correction to the wafer carrying robot 4.

When the semiconductor wafer 5B having an outside diameter of 300 mm is passed to the L-shaped hand 17a, 17b or 17c from the hand 10, the alignment control unit 31 receives image signals output from the four noncontact proprioceptors 21 to 24 to create their corresponding image data, and extracts one-line image data in the direction perpendicular to the wafer edge of the semiconductor wafer 5B based on the image data to obtain four detecting positions of the wafer edge of the semiconductor wafer 5B from the line image data.

The alignment control unit 31 obtains coordinates of three of the detecting positions of the wafer edge of the semiconductor wafer 5B, which do not contain at least orientation flat or notch information, and obtains the center of the semiconductor wafer 5B from the coordinates.

The alignment control unit 31 compares the center of the semiconductor wafer 5B and a normal center with each other to obtain an amount of displacement of the center of the semiconductor wafer 5B from the normal center.

The alignment control unit 31 obtains an amount of correction for centering from the amount of displacement and gives an instruction of the amount of correction to the wafer carrying robot 4.

The wafer carrying robot 4 moves the articulated arm and hand 10 in accordance with the amount of correction and aligns the center of the semiconductor wafer 5B held on the hand 10.

As described above, the second embodiment includes the noncontact proprioceptors 23 and 24 for both the semiconductor wafer 5A having an outside diameter of 200 mm and the semiconductor wafer 5B having an outside diameter of 300 mm, the noncontact proprioceptors 21 and 22 exclusively for the semiconductor wafer 5B having an outside diameter of 300 mm, and the noncontact proprioceptors 40 and 41 exclusively for the semiconductor wafer 5A having an outside diameter of 200 mm.

Consequently, the same advantage as that of the first embodiment can be obtained from the second embodiment.

According to the second embodiment, the semiconductor wafer 5A having an outside diameter of 200 mm need not be reciprocated in order to position the semiconductor wafer 5A having an outside diameter of 200 mm on the noncontact proprioceptors, unlike in the first embodiment. Thus, the alignment time in the second embodiment can be made shorter than that in the first embodiment.

A third embodiment of the present invention will now be described.

In the third embodiment, the configuration of the alignment apparatus according to the above-described first embodiment is changed.

Since a loader unit 1 and an inspection unit 2 are the same as the loader unit 1 and inspection unit 2 of the first embodiment, their descriptions in configuration and function are omitted to avoid overlaps.

Figure 5:
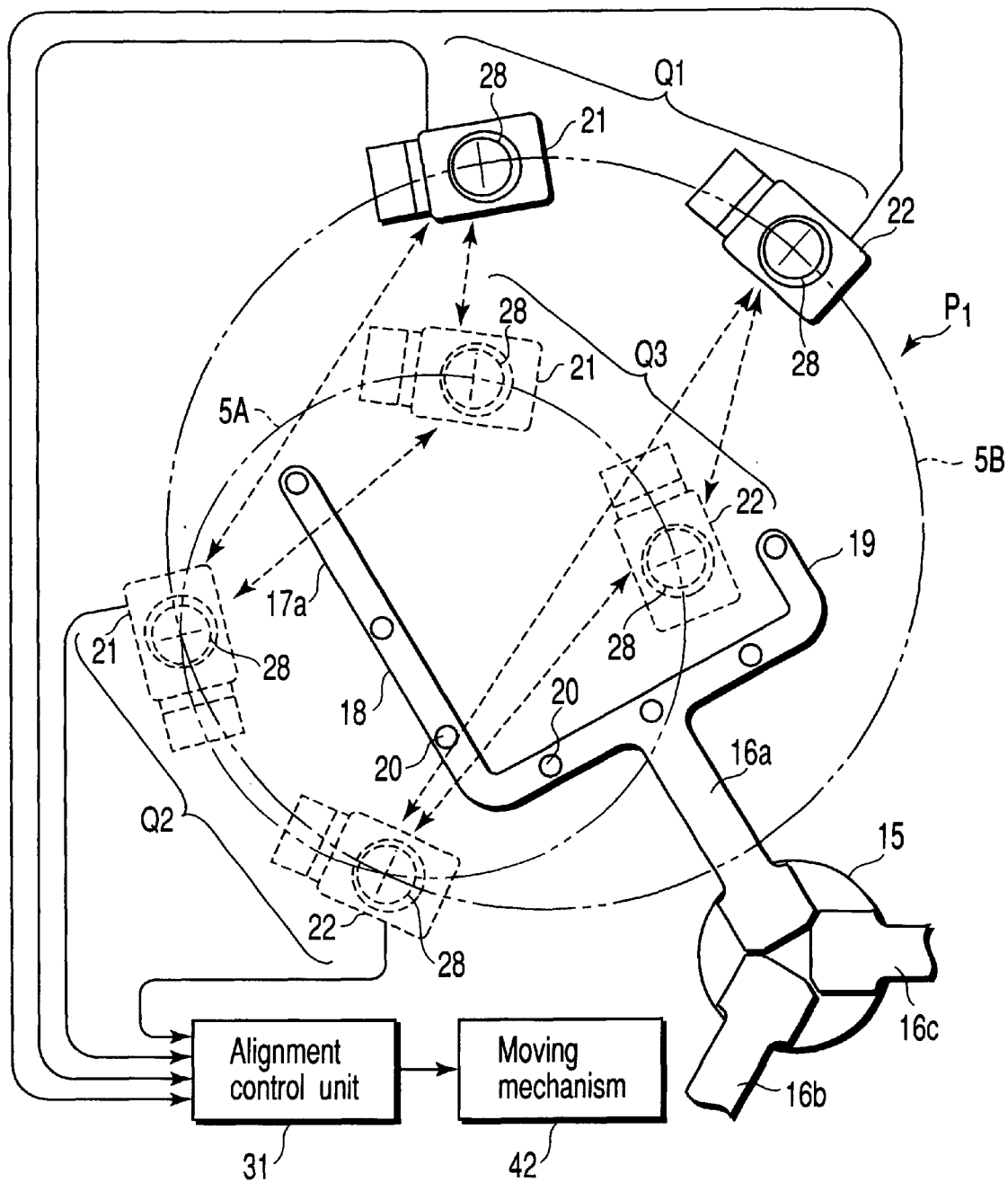
FIG. 5 is a view specifically showing an arrangement of noncontact proprioceptors in an alignment apparatus according to a third embodiment of the present invention.

FIG. 5 is a view specifically showing an arrangement of noncontact proprioceptors of the alignment apparatus according to the third embodiment of the present invention.

Two noncontact proprioceptors 21 and 22 are provided. These noncontact proprioceptors 21 and 22 are paired and can be moved to the first, second and third detecting positions $Q_1$, $Q_2$ and $Q_3$.

The movement of the noncontact proprioceptors 21 and 22 can be achieved by providing a moving mechanism such as a rail on a pedestal of the inspection unit 2.

The first and second detecting positions $Q_1$ and $Q_2$ correspond to the wafer edge of the semiconductor wafer 5B having an outside diameter of 300 mm.

The second and third detecting positions $Q_2$ and $Q_3$ correspond to the wafer edge of the semiconductor wafer 5A having an outside diameter of 200 mm.

When the semiconductor wafer 5A having an outside diameter of 200 mm or the semiconductor wafer 5B having an outside diameter of 300 mm is passed to the L-shaped hand 17a, 17b or 17c from the hand 10, a moving mechanism 42 controls the movement of the two noncontact proprioceptors 21 and 22 as follows.

When the semiconductor wafer 5B having an outside diameter of 300 mm is passed to the L-shaped hand 17a, 17b or 17c from the hand 10, the moving mechanism 42 first positions the two noncontact proprioceptors 21 and 22 in the first detecting position $Q_1$ and then in the second detecting position $Q_2$.

When the semiconductor wafer 5A having an outside diameter of 200 mm is passed to the L-shaped hand 17a, 17b or 17c from the hand 10, the moving mechanism 42 first positions the two noncontact proprioceptors 21 and 22 in the third detecting position $Q_3$ and then in the second detecting position $Q_2$.

When the semiconductor wafer 5A having an outside diameter of 300 mm is passed to the L-shaped hand 17a, 17b or 17c from the hand 10, the moving mechanism 42 first positions the two noncontact proprioceptors 21 and 22 in the first detecting position $Q_1$ and then in the second detecting position $Q_2$.

When the two noncontact proprioceptors 21 and 22 are positioned in the first detecting position $Q_1$ they detect the wafer edge of the semiconductor wafer 5B and output its image signal.

When the two noncontact proprioceptors 21 and 22 are positioned in the second detecting position $Q_2$, they detect the wafer edge of the semiconductor wafer 5B and output its image signal.

Then, the alignment control unit 31 receives image signals output from the four noncontact proprioceptors 21 to 24 to create their corresponding image data, and extracts one-line image data in the direction perpendicular to the wafer edge of the semiconductor wafer 5B based on the image data to obtain four detecting positions of the wafer edge of the semiconductor wafer 5B from the line image data.

The alignment control unit 31 obtains an amount of correction of the center of the semiconductor wafer 5B from the normal center, obtains an amount of correction for centering from the amount of displacement, and gives an instruction of the amount of correction to the wafer carrying robot 4.

The wafer carrying robot 4 moves the articulated arm and hand 10 in accordance with the amount of correction and aligns the center of the semiconductor wafer 5B held on the hand 10.

When the semiconductor wafer 5A having an outside diameter of 200 mm is passed to the L-shaped hand 17a, 17b or 17c from the hand 10, the moving mechanism 42 first positions the two noncontact proprioceptors 21 and 22 in the first detecting position $Q_1$ to the third detecting position $Q_3$ and then in the second detecting position $Q_2$.

When the two noncontact proprioceptors 21 and 22 are positioned in the third detecting position $Q_3$, they detect the wafer edge of the semiconductor wafer 5A and output its image signal.

When the two noncontact proprioceptors 21 and 22 are positioned in the second detecting position $Q_2$, they detect the wafer edge of the semiconductor wafer 5B and output its image signal.

Then, the alignment control unit 31 receives image signals output from the two noncontact proprioceptors 21 and 22 to create image data, and extracts one-line image data in the direction perpendicular to the wafer edge of the semiconductor wafer 5A based on the image data to obtain four detecting positions of the wafer edge of the semiconductor wafer 5A from the line image data.

After that, as described above, the alignment control unit 31 obtains an amount of displacement of the center of the semiconductor wafer 5A from the normal center, obtains an amount of correction for centering from the amount of displacement, and gives an instruction of the amount of correction to the wafer carrying robot 4.

The wafer carrying robot 4 moves the articulated arm and hand 10 in accordance with the amount of correction and aligns the center of the semiconductor wafer 5A held on the hand 10.

In the foregoing third embodiment, the two noncontact proprioceptors 21 and 22 are positioned in accordance with the semiconductor wafer 5A having an outside diameter of 200 mm or the semiconductor wafer 5B having an outside diameter of 300 mm.

Consequently, the same advantage as that of the first embodiment can be obtained from the third embodiment.

The two noncontact proprioceptors 21 and 22 can be used for detecting both the semiconductor wafer 5A having an outside diameter of 200 mm and the semiconductor wafer 5B having an outside diameter of 300 mm. The number of proprioceptors on the pedestal of the inspection unit 2 can be reduced.

A fourth embodiment of the present invention will now be described.

In the fourth embodiment, the configuration of the alignment apparatus according to the above-described first embodiment is changed.

Since a loader unit 1 and an inspection unit 2 are the same as the loader unit 1 and inspection unit 2 of the first embodiment, their descriptions in configuration and function are omitted to avoid overlaps.

Figure 6:
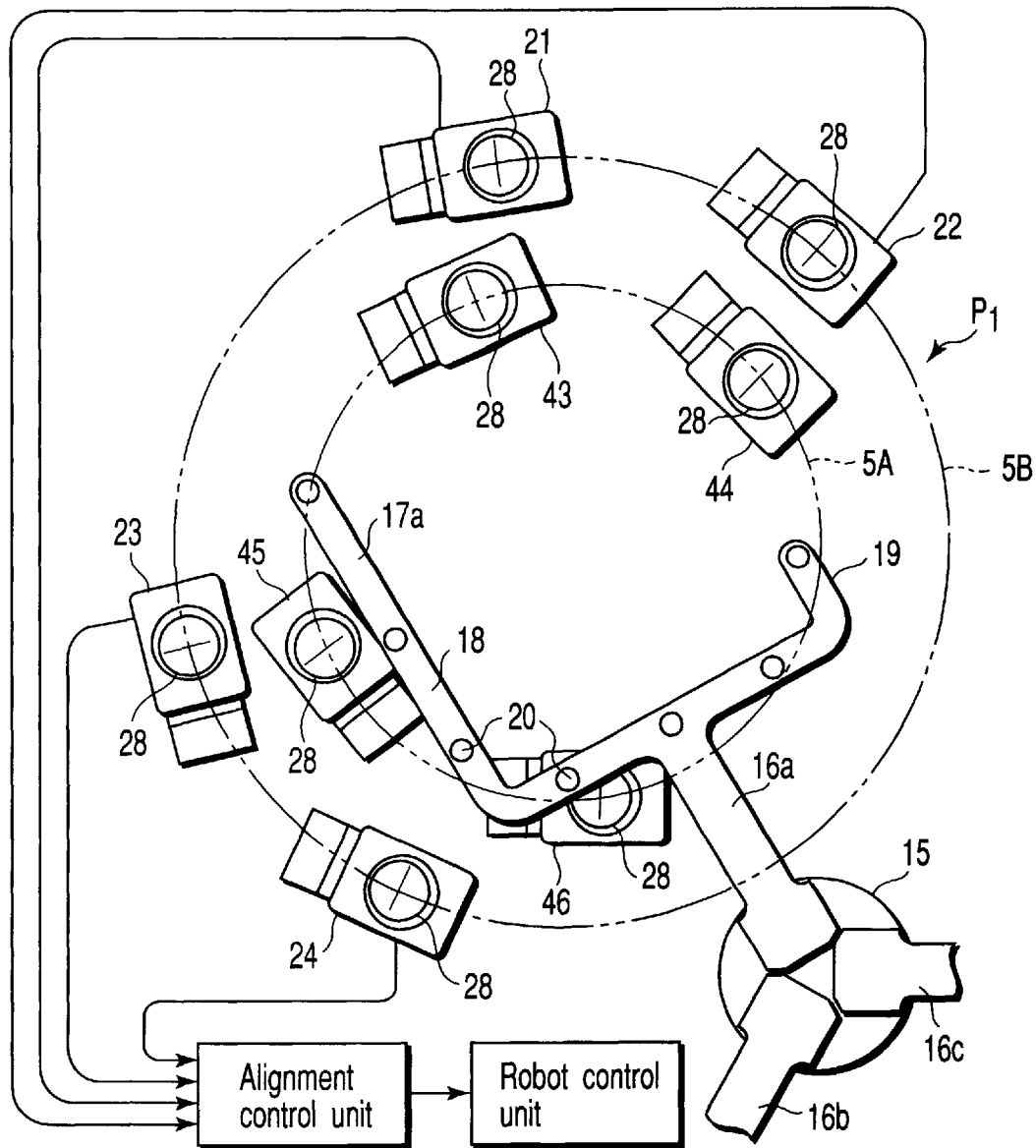
FIG. 6 is a view specifically showing an arrangement of noncontact proprioceptors in an alignment apparatus according to a fourth embodiment of the present invention.

FIG. 6 is a view specifically showing an arrangement of noncontact proprioceptors of the alignment apparatus according to the fourth embodiment of the present invention.

Four noncontact proprioceptors 43 to 46 are fixedly arranged where a semiconductor wafer 5A having an outside diameter of 200 mm is positioned. These noncontact proprioceptors 43 to 46 have the same configuration as that of the noncontact proprioceptors 21 to 24 shown in FIG. 3.

These noncontact proprioceptors 43 to 46 are arranged where their fields of view of detection cannot be blocked by the L-shaped hand 16a.

The four noncontact proprioceptors 21 to 24 are fixedly arranged where the semiconductor wafer 5B having an outside diameter of 300 mm is positioned.

These noncontact proprioceptors 21 to 24 and noncontact proprioceptors 43 to 46 are fixedly arranged on concentric circles.

When the semiconductor wafer 5A having an outside diameter of 200 mm or the semiconductor wafer 5B having an outside diameter of 300 mm is passed to the L-shaped hand 17a, 17b or 17c from the hand 10, the robot control unit 13 controls the operation of the wafer carrying robot 4 as follows.

More specifically, when the semiconductor wafer 5A having an outside diameter of 200 mm is passed to the L-shaped hand 17a, 17b or 17c from the hand 10, the wafer carrying robot 4 moves the articulated arm and hand 10 and positions the semiconductor wafer 5A, which is held on the hand 10, above the four noncontact proprioceptors 43 to 46.

When the semiconductor wafer 5B having an outside diameter of 300 mm is passed to the L-shaped hand 17a, 17b or 17c from the hand 10, the wafer carrying robot 4 moves the robot arm and hand 10 and positions the semiconductor wafer 5B, which is held on the hand 10, above the four noncontact proprioceptors 21 to 24.

The alignment control unit 31 has the following functions. When the semiconductor wafer 5A having an outside diameter of 200 mm or the semiconductor wafer 5B having an outside diameter of 300 mm is passed to the L-shaped hand 17a, 17b or 17c from the hand 10, the alignment control unit 31 receives image signals output from the four noncontact proprioceptors 43 to 46 or 21 to 24 to create their corresponding image data, and extracts one-line image data in the direction perpendicular to the wafer edge of the semiconductor wafer 5A or 5B based on the image data to obtain four detecting positions of the wafer edge of the semiconductor wafer 5A or 5B from the line image data.

The alignment control unit 31 obtains coordinates of three of the detecting positions of the wafer edge of the semiconductor wafer 5A or 5B, which do not contain at least orientation flat or notch information, and obtains the center of the semiconductor wafer 5A or 5B from the coordinates.

The alignment control unit 31 compares the center of the semiconductor wafer 5A or 5B and a normal center with each other to obtain an amount of displacement of the center of the semiconductor wafer 5A or 5B from the normal center.

The alignment control unit 31 obtains an amount of correction for centering from the amount of displacement and gives an instruction of the amount of correction to the wafer carrying robot 4.

The wafer carrying robot 4 moves the articulated arm and hand 10 in accordance with the amount of correction and aligns the center of the semiconductor wafer 5A held on the hand 10.

In the foregoing fourth embodiment, the four noncontact proprioceptors 43 to 46 are fixedly arranged in positions corresponding to the wafer edge of the semiconductor wafer 5A having an outside diameter of 200 mm, and the four noncontact proprioceptors 21 to 24 are fixedly arranged in positions corresponding to the wafer edge of the semiconductor wafer 5B having an outside diameter of 300 mm.

Consequently, the same advantage as that of the first embodiment can be obtained from the fourth embodiment.

Even when the wafer carrying robot 4 passes one of the semiconductor wafer 5A having an outside diameter of 200 mm and the semiconductor wafer 5B having an outside diameter of 300 mm to the L-shaped hand 17a, 17b or 17c, its hand 10 stops in the same position on the wafer delivery position $P_1$.

Therefore, the wafer carrying robot 4 need not change its operation depending upon the semiconductor wafer 5A having an outside diameter of 200 mm or the semiconductor wafer 5B having an outside diameter of 300 mm.

The fourth embodiment can be modified as follows.

By eliminating the four noncontact proprioceptors 43 to 46 for detecting the semiconductor wafer 5A having an outside diameter of 200 mm, the four noncontact proprioceptors 21 to 24 are freely moved between the original position in which the wafer edge of the semiconductor wafer 5B having an outside diameter of 300 mm is detected and the position in which the wafer edge of the semiconductor wafer 5A having an outside diameter of 200 mm is detected.

The present invention is not limited to the above first to fourth embodiments, but various modifications can be made without departing from the scope of the subject matter in the stage of the embodiments.

Figure 7:
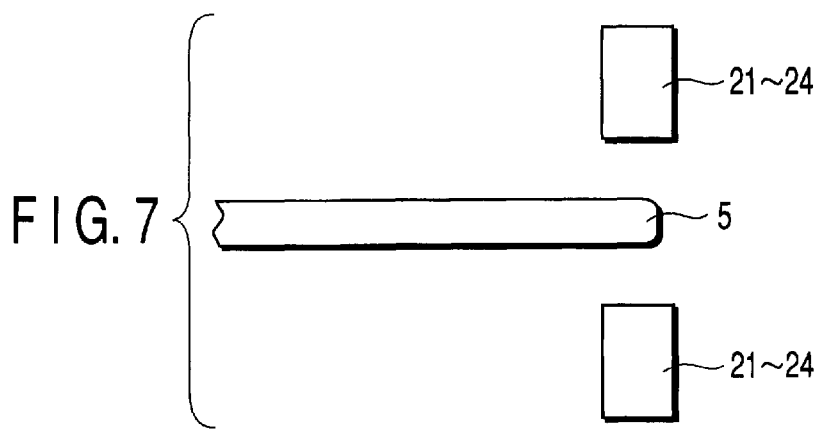
FIG. 7 is a diagram showing noncontact proprioceptors arranged on both sides of a wafer edge portion of a semiconductor wafer.

According to the first to fourth embodiments, the noncontact proprioceptors 21 to 24 are arranged under the semiconductor wafer 5. However, the noncontact proprioceptors 21 to 24 can be arranged above the surface or undersurface of the semiconductor wafer 5, as illustrated in FIG. 7.

In the apparatus according to the present invention, a rotating stage can be provided in the wafer delivery position P1 to rotate the semiconductor wafer 5 held on the rotating stage, and the position of the semiconductor wafer 5 can be controlled based on positional information of the wafer edge detected by the noncontact proprioceptors 21 to 24.

The present invention is applied to an apparatus for inspecting and measuring a semiconductor wafer or a glass substrate of a flat panel display such as a liquid crystal display by the eye or using a microscope.

According to the present invention, at least two optical sensors are provided to detect a plurality of portions of the wafer edge of a semiconductor wafer or the like. The semiconductor wafer can thus be aligned in a given position based on the portions of the wafer edge detected by the optical sensors.

What is claimed is:

1. An alignment apparatus which aligns a circular target object, comprising:

an articulated carrying robot which carries the circular target object from a storage case to a delivery position of an installed apparatus;

carrying means for receiving the circular target object from the articulated carrying robot in the delivery position and carrying the circular target object to another position in the installed apparatus;

at least two noncontact proprioceptors provided in the delivery position, the at least two noncontact proprioceptors detects edge information of three points of outer circumferences of circular target objects of different sizes, the edge information containing neither orientation flat nor notch;

moving means for moving the noncontact proprioceptors and the circular target objects relatively to dispose the outer circumferences of the circular target objects of different sizes within a range of detection of the noncontact proprioceptors; and control means for obtaining an amount of displacement between a center of the circular target object held on the articulated carrying robot and a center of the delivery position and controlling the articulated carrying robot based on the amount of displacement, thereby aligning the center of each of the circular target object with the center of the delivery position.

2. The alignment apparatus according to claim 1, wherein the noncontact proprioceptors are arranged in pairs right and left in four points of an outer circumference of a largest-diameter one of the circular target objects of different sizes; and the moving means moves the circular target object, which is carried to the delivery position by the articulated carrying robot, between the respectively paired noncontact proprioceptors.

3. The alignment apparatus according to claim 1, wherein the noncontact proprioceptors are arranged in pairs right and left in four points of the outer circumference of a largest-diameter one of the circuit target objects of different sizes, and two noncontact proprioceptors are opposed to one of the paired noncontact proprioceptors and arranged at two points of an outer circumference of a small-sized one of the circular target objects of different sizes.

4. The alignment apparatus according to claim 3, wherein the one pair of noncontact proprioceptors are arranged at two points where the outer circumference of the largest-diameter circular target object and the outer circumference of the small-sized circular target object intersect each other.

5. The alignment apparatus according to claim 1, wherein the noncontact proprioceptors are arranged at four points of the outer circumferences of the circular target objects of different sizes.

6. The alignment apparatus according to claim 1, wherein a pair of noncontact proprioceptors is arranged at two points of the outer circumference of a largest-diameter one of the circular target objects of different sizes, and the moving means moves the pair of noncontact proprioceptors to an opposite point of the outer circumference of the largest-diameter circular target object, and the noncontact proprioceptors are arranged in positions of an outer circumference of another circular target object of different size within a range of the movement.

7. The alignment apparatus according to claim 1, wherein the carrying means is a rotating arm carrying robot which circularly carries the circular target objects between the delivery position and another position of the installed apparatus, and the rotating arm carrying robot stops such that a center at which the rotating arm carrying robot receives the circular target objects coincides with the center of the delivery position.

8. The alignment apparatus according to claim 1, wherein the noncontact proprioceptors comprise a two-dimensional image pickup device including an incident-light telecentric illumination system and obtains edge information of the outer circumference of the circular target object detected by the noncontact proprioceptors from image data on one line or plural lines in a direction perpendicular to the outer circumference based on a two-dimensional image of the outer circumference of the circular target object.

9. The alignment apparatus according to claim 1, wherein the noncontact proprioceptors are arranged in such positions that the noncontact proprioceptors do not optically interfere with a hand of the articulated carrying robot and a hand of the carrying means when the outer circumference of the circular target object is detected.

* * * * *